United States Patent [19]

Seko et al.

[11] Patent Number: 5,096,936
[45] Date of Patent: Mar. 17, 1992

[54] PHOTO-CROSSLINKABLE RESIN COMPOSITION

[75] Inventors: Kenji Seko, Yokosuka; Satoshi Watanabe, Kanuma; Naozumi Iwasawa, Hiratsuka, all of Japan

[73] Assignee: Kansai Paint Company, Limited, Amagasaki, Japan

[21] Appl. No.: 476,923

[22] Filed: Feb. 8, 1990

[30] Foreign Application Priority Data

Feb. 9, 1989 [JP] Japan ................................. 1-30382

[51] Int. Cl.$^5$ .......................... C08F 20/32; C08F 4/12; C08F 24/00; C08F 270/32
[52] U.S. Cl. ........................................ 522/31; 522/29; 522/7; 522/170; 526/226; 526/268; 526/320; 526/328.5
[58] Field of Search ....................... 522/31, 7, 29, 170, 522/31

[56] References Cited

U.S. PATENT DOCUMENTS

| | | | |
|---|---|---|---|
| 4,406,764 | 9/1983 | Hayase et al. | 522/29 |
| 4,428,807 | 1/1984 | Lee et al. | 522/31 |
| 4,666,951 | 5/1987 | Onishi et al. | 522/170 |
| 4,694,029 | 9/1987 | Land | 522/31 |
| 4,835,193 | 5/1989 | Hayase et al. | 522/170 |
| 4,895,910 | 1/1990 | Isozaki et al. | 526/268 |

FOREIGN PATENT DOCUMENTS

| | | | |
|---|---|---|---|
| 0344910 | 6/1989 | European Pat. Off. | 522/31 |
| 0089616 | 5/1983 | Japan | 522/31 |

*Primary Examiner*—Marion E. McCamish
*Assistant Examiner*—Susan Berman
*Attorney, Agent, or Firm*—Armstrong, Nikaido, Marmelstein, Kubovcik & Murray

[57] ABSTRACT

The invention provides a photo-crosslinkable resin composition consisting essentially of an acrylic resin having alicyclic epoxy groups and a photo cationic polymerization initiator.

8 Claims, No Drawings

PHOTO-CROSSLINKABLE RESIN COMPOSITION

The present invention relates to a photo-crosslinkable resin composition.

Heretofore well known are photo-crosslinkable acrylic resins comprising an acrylic resin having polymerizable double bonds in the molecule and a photopolymerization initiator. These resins find wide applications as coating compositions, inks, materials for protecting electronic circuit boards, etc., but have drawbacks. For example, the product formed from the resin is unsatisfactory in the weatherability, resistance to yellowing and the like because of the numerous unreacted double bonds remaining in the photo-cured product, hence unsuitable for outdoor use. Further the product formed from the resin has a poor heat resistance and exhibits a low adhesion to substrates due to the high degree of volumetric shrinkage occurring in curing.

Also known are photo-crosslinkable resin compositions comprising a glycidyl-containing acrylic resin and a photo cationic polymerization initiator. Yet such compositions are defective. The acrylic resin in the composition contains as an epoxy group the glycidyl group derived from a glycidyl ester monomer such as a glycidyl acrylate or methacrylate. Consequently the composition has a low curability and thus fails to fully cure if only by irradiation, necessitating post cure as by postheating.

Known photo-crosslinkable resin compositions include a composition comprising a low-molecular-weight compound having 2 or 3 alicyclic epoxy groups and free of polymerizable double bond and a photo cationic polymerization initiator (Japanese Unexamined Patent Publication No.158680/1975). The composition suffers the disadvantages of having a low curability due to the low molecular weight of the compound and a poor film forming property attributable to the low viscosity and therefore for coating must be used in mixture with an epoxy resin or the like.

It is an object of the present invention to provide a novel photo-crosslinkable resin composition free of the foregoing drawbacks.

It is another object of the invention to provide a novel photo-crosslinkable resin composition capable of forming coatings having a far higher curability than conventional compositions, a high weatherability, a great resistance to yellowing and an outstanding adhesion to substrates due to the low degree of volumetric shrinkage induced during curing, and capable of exhibiting an excellent dimensional stability when used as molding materials or embedding materials.

These and other objects of the invention will become apparent from the following description.

According to the present invention, there is provided a photo-crosslinkable resin composition consisting essentially of an acrylic resin with alicyclic epoxy groups and a photo cationic polymerization initiator.

We conducted extensive research to obviate the foregoing drawbacks of the conventional resin compositions and found that a composition consisting essentially of an acrylic resin with alicyclic epoxy groups and a photo cationic polymerization initiator can fully attain the above-mentioned objects. The present invention has been accomplished on the basis of this novel finding.

In the invention, it is desirable to use acrylic resins containing alicyclic epoxy groups about 5 or more, preferably about 5 to about 1,600, more preferably about 10 to about 200, in average number per molecule and having a number-average molecular weight of about 2,000 to about 300,000, preferably about 3,000 to about 100,000, more preferably about 3,000 to about 30,000.

The above-specified acrylic resins essentially containing alicyclic epoxy groups can be prepared by conventional polymerization methods such as solution polymerization, for example by homopolymerizing an alicyclic epoxy-containing acrylate or methacrylate monomer (a) or copolymerizing the monomer (a) with a monomer (b) copolymerizable therewith in the presence of a radical polymerization initiator (hereinafter referred to as "first method").

The alicyclic epoxy-containing acrylic resin can be prepared by other methods than by the homopolymerization or copolymerization, as by reacting a compound having alicyclic epoxy group and first reactive group with an acrylic resin having second reactive group reactive with the first reactive group (hereinafter referred to as "second method").

Typical combinations of the first and second reactive groups include combinations of hydroxyl and isocyanate groups as shown in a list below

|  | First reactive group | Second reactive group |
|---|---|---|
| Combination | Hydroxyl | Isocyanate |
| " | Isocyanate | Hydroxyl |

In the above first method, representative of the alicyclic epoxy-containing acrylate or methacrylate monomers are those represented by the formulas

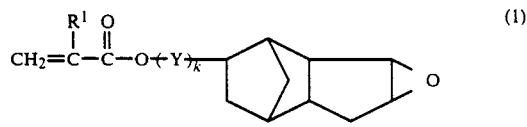

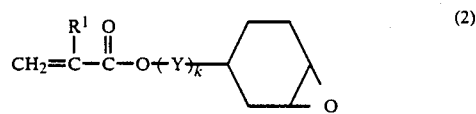

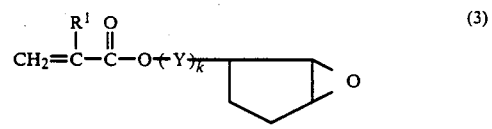

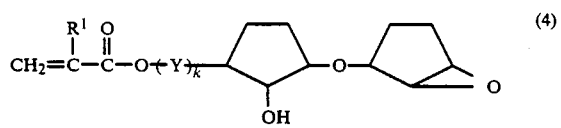

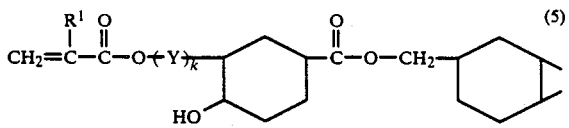

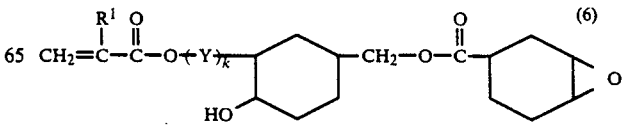

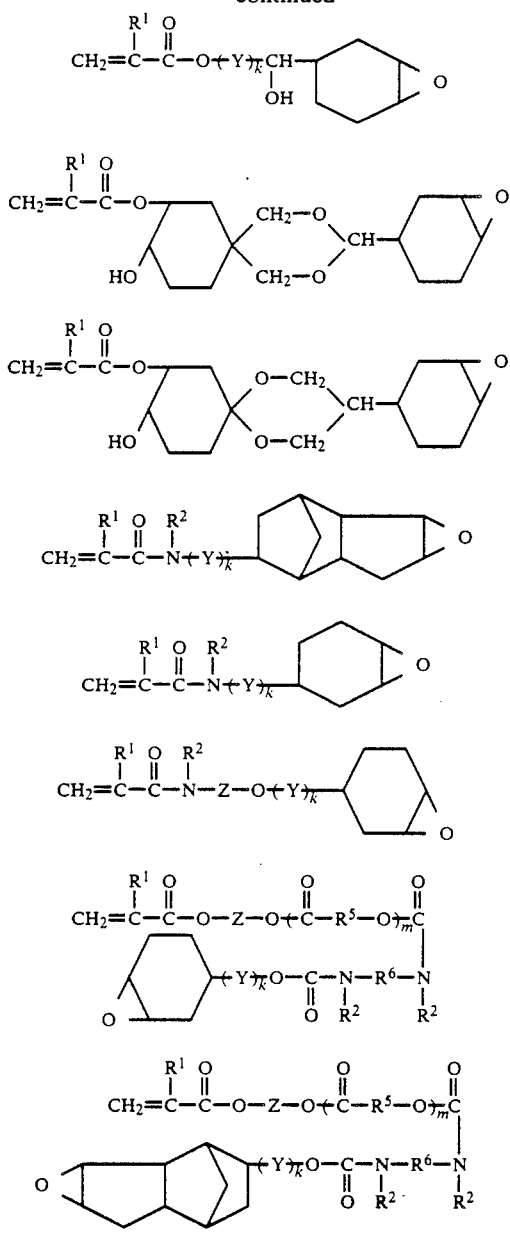

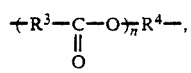

wherein $R^1$ and $R^2$ are the same or different and each represent a hydrogen atom or a methyl group, Y and Z are the same or different and each represent a bivalent group represented by $$-(-R^3-\underset{\underset{O}{\|}}{C}-O-)_{\overline{n}}R^4-,$$

$R^3$ is a bivalent aliphatic saturated hydrocarbon group having 1 to 10 carbon atoms, $R^4$ is a bivalent aliphatic saturated hydrocarbon group having 1 to 6 carbon atoms, n is an integer of 0 to 10, $R^5$ and $R^6$ are the same or different and each represent a bivalent aliphatic saturated hydrocarbon group having 1 to 10 carbon atoms, k is 0 or 1 and m is an integer of 0 to 10.

Examples of groups $R^4$ are methylene, ethylene, butylene, hexylene, isopropylene, etc. Examples of groups $R^3$, $R^5$ and $R^6$ are methylene, ethylene, butylene, hexylene, isopropylene, 2-ethylhexylene, etc.

Among the compounds exemplified above, preferred are the monomers represented by the formula (2) which are easy to commercially manufacture.

The monomer (b) copolymerizable with the alicyclic epoxy-containing acrylate or methacrylate monomer (a) in preparation of an acrylic copolymer is selectable from a wide range of conventional monomers including alkyl (1 to 22 carbon atoms) esters of acrylic or methacrylic acids such as methyl acrylate, methyl methacrylate, ethyl acrylate, ethyl methacrylate, propyl acrylate, isopropyl acrylate, butyl acrylate, butyl methacrylate, hexyl acrylate, hexyl methacrylate, 2-ethylhexyl acrylate, 2-ethylhexyl methacrylate, octyl acrylate, octyl methacrylate, lauryl acrylate, lauryl methacrylate, etc.; hydroxyalkyl (2 to 8 carbon atoms) esters of acrylic or methacrylic acids such as 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, etc.; aromatic unsaturated monomers such as styrene, α-methyl styrene and vinyltoluene, etc.; and acrylonitrile, methacrylonitrile, etc.

The amount of the monomer (b) copolymerizable with the alicyclic epoxy-containing acrylate or methacrylate monomer (a) is not specifically limited but is preferably in such range that the obtained resin contains alicyclic epoxy groups numbering 5 or more, preferably about 5 to about 1,600, on the average per molecule. A suitable amount of the monomer (b) is about 99.7 % by weight or less, preferably about 97% by weight or less, more preferably about 90% by weight or less, based on the combined amount of the monomers.

In the second method for preparation of the acrylic resin, hydroxyl and isocyanate groups can be mentioned as representative examples of the first reactive group present in the alicyclic epoxy-containing compound. Typical of alicyclic epoxy-containing compounds with hydroxyl as the first reactive group are the compounds represented by the formulas (15) to (23)

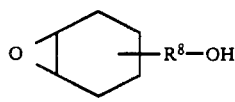

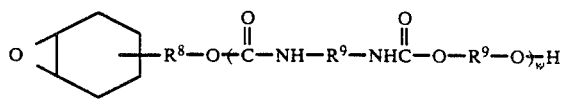

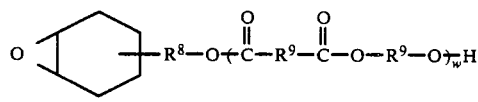 (17)

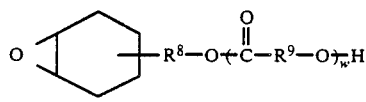 (18)

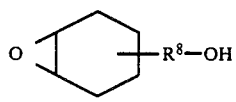 (19)

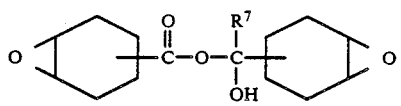 (20)

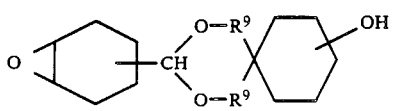 (21)

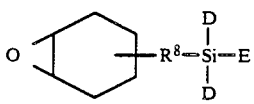 (22)

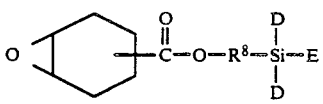 (23)

wherein $R^7$ is a hydrogen atom or a methyl group, $R^8$ is a hydrocarbon group having 1 to 8 carbon atoms, the groups $R^9$ are the same or different and are each a hydrocarbon group having 1 to 20 carbon atoms, w is an integer of 1 to 7, the groups D are the same or different and are each an alkoxyl group, an alkyl group, an aryl group or an aralkyl group all having 1 to 8 carbon atoms or a hydrogen atom, and E is a hydroxyl group or a hydroxyalkyl group having 1 to 8 carbon atoms.

Examples of the groups $R^8$ are methyl, ethyl, propyl, butyl, hexyl, octyl, phenyl, toluyl, xylyl, benzyl, phenethyl and the like. Examples of the groups $R^9$ include the same groups as the groups $R^8$ and decyl, lauryl, stearyl and the like. Examples of the groups D include the same groups as the groups $R^8$ and methoxy, ethoxy, propoxy, butoxy and the like. Examples of the groups E are hydroxyl, hydroxymethyl, hydroxyethyl, hydroxypropyl, hydroxybutyl and the like.

Specific examples of the compounds represented by the formulas (15) to (23) include those represented by the formulas

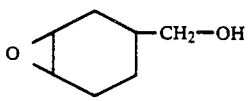

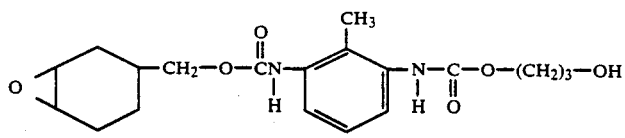

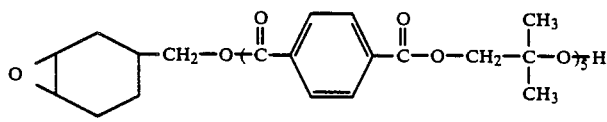

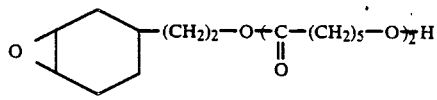

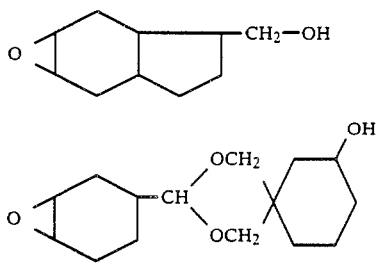

An alicyclic epoxy-containing compound having isocyanate as the first reactive group can be prepared by reacting an alicyclic epoxy-containing compound having hydroxyl as the first reactive group with a polyisocyanate compound (c) in such proportions as to include isocyanate exceeding hydroxyl in the content so that the resulting reaction product contains both alicyclic epoxy and isocyanate groups in the molecule.

Examples of the polyisocyanate compound (c) for use in the foregoing reaction are tolylene diisocyanate, xylylene diisocyanate, hexamethylene diisocyanate, trimethylhexamethylene diisocyanate, isophorone diisocyanate, hydrogenated diphenylmethane diisocyanate, diphenylmethane diisocyanate, lysine diisocyanate and like polyisocyanate compounds, isocyanate-terminated compounds prepared by reacting an excess amount of the polyisocyanate compound with water, ethylene glycol, propylene glycol, trimethylol propane, hexanetriol, castor oil or like low-molecular-weight active hydrogen-containing compound, polymers of these polyisocyanate compounds, biurets, etc.

Acrylic resins for use in the second method which contain second reactive group reactive with the first reactive group are those having isocyanate as the second reactive group when the first reactive group is hydroxyl and those having hydroxyl as the second reactive group when the first reactive group is isocyanate.

Examples of the acrylic resin having isocyanate as the second reactive group include a homopolymer of an isocyanate-containing polymerizable unsaturated monomer (d) and a copolymer comprising the monomer (d) and a polymerizable unsaturated monomer (f).

Examples of the isocyanate-containing polymerizable unsaturated monomer (d) include the monomers represented by the formulas (24) and (25).

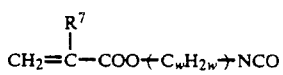
(24)

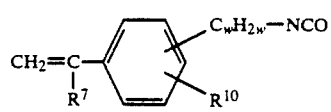
(25)

wherein $R^7$ and w are as defined above and $R^{10}$ is a hydrogen atom or an alkyl group having 1 to 5 carbon atoms.

Specific examples of the monomers of the formulas (24) and (25) are isocyanate ethyl acrylate or methacrylate, α,α-dimethyl-m-isopropenylbenzyl isocyanate, etc.

Other isocyanate-containing polymerizable unsaturated monomers (d) than the monomers of the formulas (24) and (25) include an adduct prepared by reacting 1 mole of a monohydroxyl-containing polymerizable unsaturated monomer (e) with 1 mole of a polyisocyanate compound by the conventional method.

Examples of the hydroxyl-containing polymerizable unsaturated monomer (e) include the monomers represented by the formulas (26) and (27)

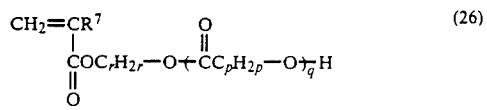
(26)

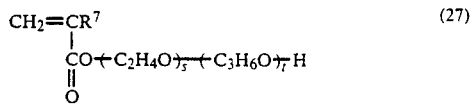
(27)

wherein $R^7$ is as defined above, p is an integer of 2 to 18, q is an integer of 0 to 7, γ is an integer of 2 to 8, and s and t are each an integer of 0 to 8 provided that the sum of s and t is an integer of 2 to 8. Representative of the monomer (e) are those represented by the following formulas $CH_2=CH(CH_3)COOC_2H_4OH$,
$CH_2=CH(CH_3)COOC_3H_6OH$,

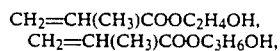

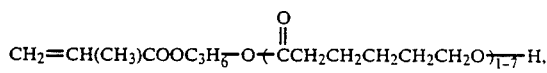

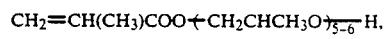

The compounds exemplified above as the polyisocyanate compound (c) are usable as the polyisocyanate compound to be reacted with the monomer (e).

Examples of the polymerizable unsaturated monomer (f) copolymerizable with the isocyanate-containing polymerizable unsaturated monomer (d) for preparation of the isocyanate-containing acrylic resin are inclusive of the above examples of the copolymerizable monomer (b) for use in the first method although exclusive of hydroxyl-containing monomers such as hydroxylalkyl acrylates or methacrylates.

The acrylic resin having hydroxyl as the second reactive group can be prepared by conventional methods such as solution polymerization, for example by homopolymerizing the hydroxyl-containing polymerizable unsaturated monomer (e) or copolymerizing the monomer (e) with the polymerizable unsaturated monomer (f) in the presence of a radical polymerization initiator.

In the second method, the reaction between the alicyclic epoxy- and hydroxyl-containing compound and the isocyanate-containing acrylic resin and the reaction between the alicyclic epoxy- and isocyanate-containing compound and the hydroxyl-containing acrylic resin can be run by conventional methods as by heating at about 30 to about 120° C. with or without an organic solvent in the presence or the absence of a catalyst such as an organotin compound, tertiary amine or the like.

It is suitable that the alicyclic epoxy-containing acrylic resin prepared by the first or second method have alicyclic epoxy groups numbering about 5 or more, preferably about 5 to about 1,600, more preferably about 10 to about 200, on the average per molecule. The alicyclic epoxy-containing acrylic resin has a number-average molecular weight of about 2,000 to about 300,000, preferably about 3,000 to about 100,000, more preferably about 3,000 to about 30,000.

Examples of the photo cationic polymerization initiator in the composition of the invention are aromatic onium salts such as photosensitive aromatic onium salts of elements pertaining to the VIa Group and represented by the formulas

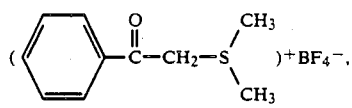

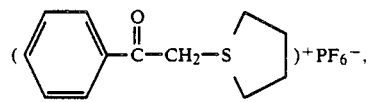

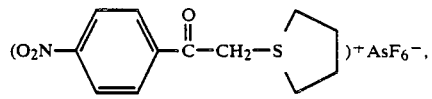

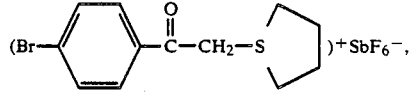

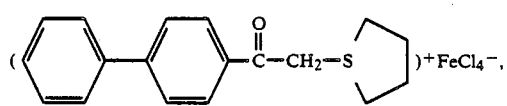

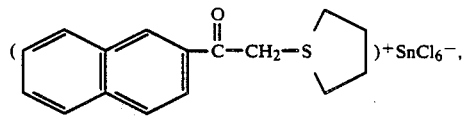

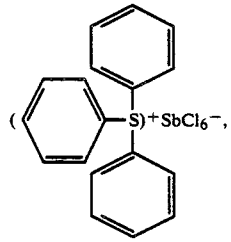

-continued

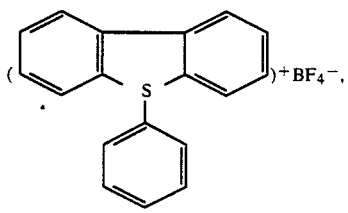

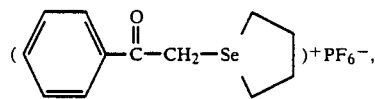

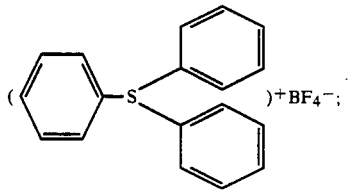

photosensitive aromatic onium salts of elements pertaining to the Va Group and represented by the formulas

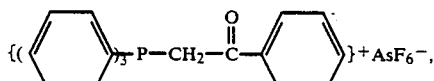

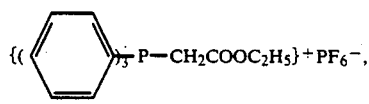

photosensitive aromatic onium salts of transition metal elements represented by the formulas and photosensitive aromatic onium salts of halogen elements represented by the formulas Other examples of photo cationic polymerization initiators are (i) benzoyl sulfonates represented by the formula (28)

wherein $R^{11}$ is an alkyl group having 1 to 12 carbon atoms or a hydrogen atom; (ii) a mixture of (A) a compound represented by the formula (29)

wherein $R^{12}$ is a hydrogen atom, a chlorine atom and a bromine atom, an alkyl group having 1 to 6 carbon atoms or a group represented by $-ClF_2l+1$ (wherein l is an integer of 1 to 4), and $R^{13}$ is a hydrogen atom, chlorine atom, bromine atom or an alkyl group having 1 to 6 carbon atoms, and (B) an aluminum chelate compound such as tris(ethylacetonacetate) aluminum, tris-(acetylacetonato)aluminum, etc.; (iii) a mixture of (A) a sillyl peroxide compound represented by the formula

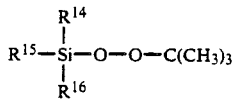  (30)

wherein $R^{14}$, $R^{15}$ and $R^{16}$ are the same or different and each represent a phenyl group, a p-chlorophenyl group or a naphthyl group, and (B) an aluminum chelate compound such as tris(ethylacetoacetate)aluminum, tris-(acetylacetonatom)aluminum, etc.

Examples of the alkyl groups $R^{11}$, $R^{12}$ and $R^{13}$ in the formulas (28) and (29) are methyl, ethyl, t-butyl and the like as $R^{11}$ groups, methyl, ethyl and the like as $R^{12}$ groups, and methyl, t-butyl and the like as $R^{13}$ groups. And $-CF_3$ is exemplary of the group $-ClF_{2l+1}$ in the formula (29).

The amount of the photo cationic polymerization initiator for use herein is about 0.05 to about 20 parts by weight, preferably about 0.5 to about 10 parts by weight, per 100 parts by weight of the acrylic resin having alicyclic epoxy groups.

The resin composition of the invention may contain additives when so required in addition to the acrylic resin having alicyclic epoxy groups and the photo cationic polymerization initiator as the essential components. Examples of useful additives are sensitizers, solvents, resins for modification, reactive compounds, dyes, pigments, leveling agents, cissing inhibitors, etc.

Representative examples of the sensitizer useful for accelerating the curing reaction are 2,6-bis(p-dimethylaminobenzylidene) cyclohexanone, 4-t-butyl-2,6-bis(4'-dimethylaminobenzylidene)cyclohexanone, 3,3'-carbonylbis(7-diethylaminocoumarin), 3-(2'-benzimidazolyl)-7-dimethylaminocoumarin, 9,10-dimethoxy-2-ethylanthracene and N-phenylglycin, etc.

Examples of preferred resins for modification are those having photo cationic polymerizability such as glycidyl ether-based epoxy resins, glycidyl ester-based epoxy resins, acrylic resins having glycidyl groups as epoxy groups, etc. Examples of useful reactive compounds are those having epoxy groups such as alicyclic epoxy groups and represented by the formulas

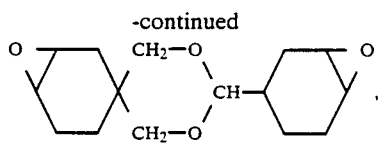

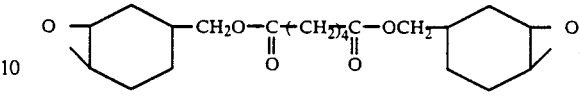

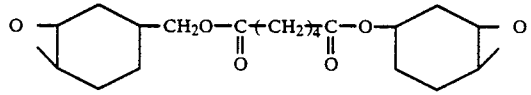

The combined amount of the resin for modification and the reactive compound is preferably about 100 parts by weight or less per 100 parts by weight of the acrylic resin having alicyclic epoxy groups in view of a high curability.

The composition of the invention is cured by irradiation, preferably application of ultraviolet rays. Examples of the light source for use herein are an extra-high pressure mercury lamp, high pressure mercury lamp, metal halide lamp, etc. The composition of the invention may be cured by heating and irradiation in combination. When the composition of the invention contains a solvent, the solvent is preferably removed before use as by heating. The composition incompletely cured by irradiation may be heated to cure. The photo cationic polymerization initiator that is activated by irradiation can act as the thermal polymerization initiator by heating.

The composition of the invention has a high curability and is curable into a product outstanding in the weatherability, resistance to yellowing, heat resistance and adhesion to substrates and usable for wide applications because of the advantage of low degree of volumetric shrinkage involved during curing.

The composition of the invention can be used for various purposes, for example, as materials for hard coatings for outdoor use, inks, coating compositions for substrates of glass, ceramics or metals, packaging materials for electronic components, sealants, etc.

The invention will be described below in greater detail with reference to the following preparation examples, working examples and comparison examples in which the parts and percentages are all by weight unless otherwise specified.

PREPARATION EXAMPLE 1

| | |
|---|---|
| 3,4-Epoxycyclohexyl methyl methacrylate | 100 parts |
| 2,2'-Azobisisobutyronitrile | 3 parts |

A flask was charged with 50 parts of xylene and 50 parts of isobutyl acetate, and the mixture of the above ingredients was added dropwise over a period of 3 hours to the solvent mixture heated to 100° C. The resulting mixture was maintained at 100° C. for 3 hours to obtain an acrylic resin solution A having a solids content of about 50%. The obtained resin had a number-average molecular weight of about 16,000 and contained about 81.5 alicyclic epoxy groups on the average per molecule.

PREPARATION EXAMPLE 2

| | |
|---|---|
| n-Butyl methacrylate | 50 parts |
| t-Butylperoxyoctoate | 2 parts |

A flask was charged with 70 parts of toluene and 20 parts of isobutanol, and the mixture of the above ingredients was added dropwise over a period of 3 hours to the solvent mixture heated to 110° C. One hour after the addition of the monomer mixture, to the resulting mixture maintained at 100° C. was added dropwise a solution of 1 part of t-butyl peroxyoctoate in 10 parts of toluene over a period of 1 hour. The mixture was kept at 100° C. for 2 hours to give an acrylic resin solution B having a solids content of about 50%. The obtained acrylic resin had a number-average molecular weight of about 20,000 and contained about 26 alicyclic epoxy groups on the average per molecule.

PREPARATION EXAMPLE 3

| | |
|---|---|
| 3,4-Epoxycyclohexyl-methyl acrylate | 25 parts |
| 2-Hydroxyethyl acrylate | 10 parts |
| n-Butyl methacrylate | 65 parts |
| Benzoyl peroxide | 6 parts |

A flask was charged with 90 parts of toluene and 10 parts of methyl isobutyl ketone, and the mixture of the above ingredients was added dropwise to the solvent mixture heated to 90° C. over a period of 4 hours. The resulting mixture was maintained at 90° C. for 2 hours to give an acrylic resin solution C having a solids content of about 50%. The obtained acrylic resin had a number-average molecular weight of about 9,500 and contained about 13 alicyclic epoxy groups on the average per molecule.

PREPARATION EXAMPLE 4 (FOR COMPARISON)

| | |
|---|---|
| Glycidyl methacrylate | 100 parts |
| n-Butyl acrylate | 50 parts |
| 2,2'-Azobisisobutyronitrile | 4 parts |

A flask was charged with 150 parts of ethylene glycol monoethyl ether which was then heated to 100° C. Added dropwise thereto was 154 parts of the mixture of the above ingredients over a period of 3 hours. The mixture was maintained at 100° C. for 3 hours, and 0.02 part of hydroquinone was added. To the mixture was added dropwise a mixture of 51 parts of acrylic acid and 0.3 part of tetraammonium bromide over a period of 1 hour. The obtained mixture was kept at 100° C. for 3 hours to give an acrylic resin solution F having a solids content of about 57% and containing polymerizable unsaturated groups. The obtained acrylic resin was about 18,000 in the number-average molecular weight and 1.2 in the acid value and contained about 63 polymerizable unsaturated groups on the average per molecule.

PREPARATION EXAMPLE 5 (FOR COMPARISON)

| | |
|---|---|
| Glycidyl methacrylate | 50 parts |
| n-Butyl methacrylate | 50 parts |
| t-Butyl peroxyoctoate | 6 parts |

The same procedure as in Preparation Example 2 was repeated with the exception of using 106 parts of the mixture of the above ingredients in place of 102 parts of the mixture shown in Preparation Example 2, giving an acrylic resin solution G having a solids content of about 50%. The obtained acrylic resin had a number-average molecular weight of about 11,000 and contained about 39 glycidyl groups on the average per molecule.

PREPARATION EXAMPLE 6

| | |
|---|---|
| Isocyanato ethyl methacrylate | 156 parts |
| Butyl methacrylate | 500 parts |
| Ethyl acrylate | 344 parts |
| 2,2'-Azobisisobutyronitrile | 60 parts |

One thousand parts of n-butyl acetate was placed into a flask and heated at 90° C. and the mixture of the above ingredients was added dropwise over a period of 3 hours. Then the mixture was maintained at 90° C. for 3 hours to give a solution of an isocyanate-containing acrylic resin with a solids content of 50%. The resin had a number-average molecular weight of about 16,500.

A 1,000-part portion of the obtained solution of isocyanate-containing acrylic resin, 178 parts of butyl acetate and 178 parts of a compound of the formula

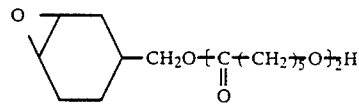

were mixed together and reacted at 50° C. for 3 hours, giving a solution of an acrylic resin J with a solids content of 50%. The resin had a number-average molecular weight of 16,000 and contained above 25 alicyclic epoxy groups on the average per molecule.

PREPARATION EXAMPLE 7

| | |
|---|---|
| Styrene | 300 parts |
| Hydroxyethyl acrylate | 116 parts |
| n-Butyl methacrylate | 584 parts |
| t-Butyl peroxyoctoate | 60 parts |

A flask was charged with 1,000 parts of isobutyl acetate which was then heated to 110° C., and the mixture of the above ingredients was added dropwise over a period of 3 hours. Then the mixture was maintained at 90° C. for 3 hours, giving a solution of a hydroxyl-containing acrylic resin with a solids content of 50%. The resin had a number-average molecular weight of about 12,000.

The obtained solution (1,000 parts), 0.1 part of dibutyltin dilaurate, 289 parts of isobutyl acetate and 289 parts of a compound of the formula

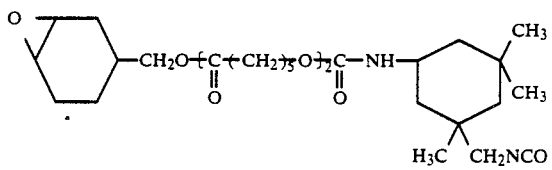

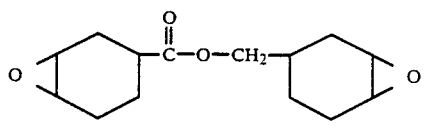

were mixed together and reacted at 70° C. for 5 hours, giving a solution of an acrylic resin K with a solids content of 50%. The resin had a number-average molecular weight of about 18,000 and contained about 11.5 alicyclic epoxy groups on the average per molecule.

EXAMPLES 1 TO 5 AND COMPARISON EXAMPLES 1 AND 2

Resin compositions were prepared by mixing each of the acrylic resin solutions obtained in Preparation Examples 1 to 7 with the photo cationic polymerization initiator shown below in Table 1 in the amount indicated.

TABLE 1

|  | Example | | | | | Comp. Ex. | |
|---|---|---|---|---|---|---|---|
|  | 1 | 2 | 3 | 4 | 5 | 1 | 2 |
| Acrylic resin | | | | | | | |
| Kind of solution | A | B | C | J | K | F | G |
| Solids content (part) | 100 | 100 | 100 | 100 | 100 | 100 | 100 |
| Photopolymerization initiator | | | | | | | |
| Kind | *1 | *2 | *2 | *1 | *2 | Benzoin ethyl ether | *2 |
| Amount (part) | 3 | 3 | 3 | 3 | 3 | 5 | 3 |

(Note)
In Table 1, the marks *1 and *2 mean:
*1: A photo cationic polymerization initiator represented by the formula

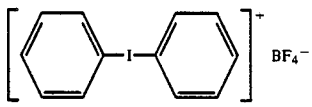

*2: A photo cationic polymerization initiator represented by the formula

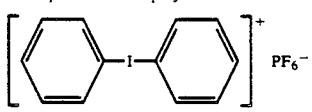

EXAMPLE 6

A resin composition was prepared by admixing 200 parts (100 parts calculated as solids) of the acrylic resin solution obtained in Preparation Example 3 with 3 parts of the photo cationic polymerization initiator *2 and 30 parts of "Celloxide #2021" (product of Daicel Chemical Industries, Ltd.) which is represented by the formula The obtained resin composition was applied to each substrate (polished mild steel sheet, aluminum plate and glass plate) to a dry thickness of about 27 μm. The coated substrate was heated at 50° C. for 20 minutes to remove the solvent and exposed to light rays from a high pressure mercury lamp (80 W/cm) in an amount of 100 mj/cm² to cure the coating.

The coatings were tested for properties by the following methods. Certain of the cured coatings were post-heated before testing.

1. Gel fraction ratio

The coating was separated from the glass plate and immersed in acetone at about 57° C. (with refluxing) for 4 hours for extraction. The gel fraction ratio was given by the following equation.

$$\text{Gel fraction ratio (\%)} = \frac{\text{Weight of coating after extraction with acetone}}{\text{Weight of coating before immersion in acetone}} \times 100$$

2. Pencil hardness

The pencil hardness of the coating on the polished mild steel sheet was determined according to the pencil scratch test as specified in JIS K 5400 6.14.

3. Adhesion

According to JIS K540-1979 6.15, a lattice pattern with eleven cuts in each direction was made in the coating to the substrate to form 100 squares (1 mm × 1 mm), cellophane adhesive tape was applied over the lattice and removed rapidly. The adhesive was evaluated in terms of the number of squares remaining adhering to the lattice after removal with the tape.

4. Weatherability

The weathability of the coating on the polished mild-steel sheet was determined by a sunshine weather-o-meter according to JIS A 1415. After 1500 hours of testing, the coating was observed with the unaided eye to evaluate the degree of yellowing, and the resistance to cracking was determined in terms of the time lapsed until the occurrence of cracking in the coating. The coating which caused no change during the 1500-hour testing was represented as "1500<" (hours).

Table 2 shows the test results.

TABLE 2

|  | Example | | | | | | | | | |
|---|---|---|---|---|---|---|---|---|---|---|
|  | 1 | | 2 | | 3 | | 4 | | 5 | |
| Conditions for post-heating | — | 100° C. 20 min | — | 100° C. 20 min | — | 100° C. 20 min | — | 100° C. 20 min | — | 100° C. 20 min |
| State of coating surface | Good | Good | Good | Good | Good | Good | Good | Good | Good | Good |
| Gel fraction ratio | 85.1 | 92.3 | 93.1 | 98.1 | 87.8 | 91.8 | 85.4 | 94.5 | 86.2 | 93.8 |
| Pencil hardness | 6H | 9H | 4H | 7H | 6H | 8H | 4H | 6H | 6H | 8H |
| Adhesion | | | | | | | | | | |
| Mild steel sheet | 100 | 100 | 100 | 100 | 100 | 100 | 100 | 100 | 100 | 100 |
| Glass plate | 100 | 100 | 100 | 100 | 100 | 100 | 100 | 100 | 100 | 100 |

TABLE 2-continued

| | | | | | | | | | | |
|---|---|---|---|---|---|---|---|---|---|---|
| Aluminum plate | 100 | 100 | 100 | 100 | 100 | 100 | 100 | 100 | 100 | 100 |
| Weatherability | | | | | | | | | | |
| Degree of yellowing | No change | No change | No change | No change | No change | No change | No change | No change | No change | No change |
| Resistance to cracking (hour) | 1500< | 1500< | 1500< | 1500< | 1500< | 1500< | 1500< | 1500< | 1500< | 1500< |

| | Example | | Comparison Example | | | | |
|---|---|---|---|---|---|---|---|
| | 6 | | 1 | | 2 | | |
| Conditions for post-heating | — | 100° C. 20 min | — | 100° C. 20 min | — | 100° C. 20 min | 140° C. 20 min |
| State of coating surface | Good | Good | Sticky | Good | Sticky | Sticky | Good |
| Gel fraction ratio | 95.1 | 98.3 | 86.1 | 90.6 | 5.3 | 28.1 | 72.3 |
| Pencil hardness | 6H | 9H | 2H | 2H | Softer than 6B | Softer than 6B | B |
| Adhesion | | | | | | | |
| Mild steel sheet | 100 | 100 | 80 | 50 | — | — | 100 |
| Glass plate | 100 | 100 | 0 | 0 | — | — | 100 |
| Aluminum plate | 100 | 100 | 70 | 50 | — | — | 100 |
| Weatherability | | | | | | | |
| Degree of yellowing | No change | No change | Marked yellowing | Marked yellowing | — | — | Slight Yellowing |
| Resistance to cracking (hour) | 1500< | 1500< | 500 | 500 | — | — | 500 |

PREPARATION EXAMPLES 8, 9 and 10

An acrylic resin solution D (Preparation Example 8) was prepared by removing the solvent from the acrylic resin solution B prepared in Preparation Example 2 at 90° C. under reduced pressure until the solids content of the resin solution reached 98%. The same procedure was repeated to give an acrylic resin solution E (Preparation Example 9) from the acrylic resin solution C prepared in Preparation Example 3.

An acrylic resin solution H (Preparation Example 10 for Comparison) was prepared in the same manner as above from the acrylic resin solution G prepared in Preparation Example 5.

PREPARATION EXAMPLE 11

The acrylic resin solution F prepared in Preparation Example 4 was added to a large quantity of n-hexane for the separation of the resin. The separated resin was washed with n-hexane twice and dried at 40° C. to give an acrylic resin solution I having a solids content of about 98%.

EXAMPLES 7 AND 8 AND COMPARISON EXAMPLES 3 TO 5

The acrylic resin solutions obtained in Preparation Examples 8 to 11 and other components were mixed together in the proportions as shown below in Table 3, giving resin compositions. Each of the resin compositions was placed into a contained (10 mm × 10 mm × 10 mm) made of mild steel sheet and irradiated with light from a high pressure mercury lamp (80 W/cm) to cure the composition. The cured products were tested for properties by the following methods. Certain of the cured products were post-heated before testing. Table 4 below shows the results.

5. Dimensional stability

The completely cured products in the container were observed with the unaided eye, and the dimensional stability was assessed according to the following criteria:

A: The cured product had a flat surface at the exposed portion and remained closely adhering to the container at the other portions.

B: The cured product had a dented surface at the exposed portion and was partly separated from the container at the other portions without adhering thereto.

6. Gel fraction ratio

The cured resin product was finely divided into particles which were immersed in acetone at about 57° C. (with refluxing) for 4 hours for extraction. The gel fraction ratio was given by the following equation.

Gel fraction ratio (%) =

$$\frac{\text{Weight of cured resin after extraction with acetone}}{\text{Weight of cured resin before immersion in acetone}} \times 100$$

TABLE 3

| | Example | | Comp. Example | | |
|---|---|---|---|---|---|
| | 7 | 8 | 3 | 4 | 5 |
| Acrylic resin | | | | | |
| Kind of resin solution | D | E | H | I | H |
| Solids content (parts) | 100 | 100 | 100 | 100 | 100 |
| Celloxide #2021 | 25 | 25 | — | — | 25 |
| Epikoat #828 (*4) | — | — | 25 | — | — |
| Trimethylolpropane triacrylate | — | — | — | 25 | — |
| Polymerization initiator | | | | | |
| Kind | *2 | *5 | *2 | Benzoin ethyl ether | *2 |
| Amount (part) | 3 | 3 | 3 | 5 | 3 |

In Table 3, the mark *2 has the same meaning as in Table 1. The marks *4 and *5 denote:
*4: "Epikoat #828" is the trade name for a glycidyl ether-based epoxy resin which is about 190 in the epoxy equivalent and about 380 in the molecular weight, product of Shell Chemical Co.
*5: A photo cationic polymerization initiator represented by the formula

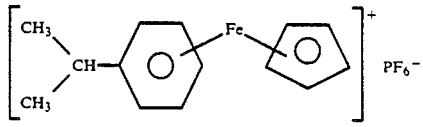

TABLE 4

|  | Example | | | | Comparison Example | | | | | |
| --- | --- | --- | --- | --- | --- | --- | --- | --- | --- | --- |
|  | 7 | | 8 | | 3 | | | 4 | | 5 |
| Amount of light (mj/cm$^2$) | 1000 | 500 | 1000 | 500 | 1000 | 1000 | 500 | 1000 | 1000 | 1000 |
| Conditions for post-heating | — | 100° C. 30 min | — | 100° C. 30 min | 100° C. 30 min | 160° C. 30 min | — | 100° C. 30 min | 100° C. 30 min | 160° C. 30 min |
| Degree of curing | Very hard | Very hard | Very hard | Very hard | Soft and sticky | Hard | Hard | Hard | Soft and sticky | Hard |
| Dimensional stability | A | A | A | A | A | A | B | B | A | B |
| Gel fraction ratio (%) | 93.5 | 98.1 | 94.1 | 97.6 | 10.5 | 75.1 | 87.1 | 93.1 | 30.7 | 79.4 |

We claim:

1. A photo-crosslinkable resin composition consisting essentially of an acrylic resin having alicyclic epoxy groups and a photo-cationic polymerization initiator, wherein the acrylic resin does not contain terminal olefinic unsaturation and is selected from the group consisting of a homopolymer of an acrylate or methacrylate monomer containing alicyclic epoxy groups; a copolymer of said acrylate or methacrylate monomer and another monomer selected from alkyl esters of acrylic or metharylic acids wherein the alkyl moiety has 1-22 carbon atoms and hydroxyalkyl esters of acrylic or methacrylic acids wherein the hydroxyalkyl ester moiety has 2-8 carbon atoms; a reaction product obtained by reacting a compound having an alicyclic epoxy group and a hydroxyl group with an acrylic resin having an isocyanate group; and a reaction product obtained by reacting a compound having an alicyclic epoxy group and an isocyanate group with an acrylic resin having a hydroxyl group.

2. A composition according to claim 1 wherein the acrylic resin has a number-average molecular weight of about 2,000 to about 300,000 and contains about 5 or more alicyclic epoxy groups on the average per molecule.

3. A composition according to claim 2 wherein the acrylic resin contains about 5 to about 1,600 alicyclic epoxy groups on the average per molecule.

4. A composition according to claim 1 wherein the acrylate or methacrylate monomer is a compound represented by the formula

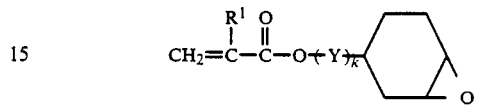

wherein R$^1$ is a hydrogen atom or a methyl group, Y is a bivalent group represented by

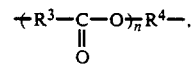

R$^3$ is a bivalent aliphatic saturated hydrocarbon group having 1 to 10 carbon atoms, R$^4$ is a bivalent aliphatic saturated hydrocarbon group having 1 to 6 carbon atoms, n is an integer of 0 to 10 and k is 0 or 1.

5. A composition according to claim 1 wherein the amount of the monomer copolymerizable with the alicyclic epoxy-containing acrylate or methacrylate monomer is 99.7% by weight or less based on the combined amount of the monomers.

6. A composition according to claim 1 wherein the photo cationic polymerization initiator is an aromatic onium salt.

7. A composition according to claim 1 wherein the amount of the photo cationic polymerization initiator is about 0.05 to about 20 parts by weight per 100 parts by weight of the acrylic resin.

8. A composition according to claim 1 wherein said acrylic resin is prepared from 3,4-epoxycyclohexyl methyl methacrylate and said photo-initiator is:

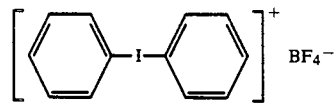

* * * * *